United States Patent [19]

Shaw et al.

[11] Patent Number: 5,192,641
[45] Date of Patent: Mar. 9, 1993

[54] METHOD OF THERMAL WAX TRANSFER AS A MASK FOR DIGITAL COLOR PROOFING

[75] Inventors: Sonya Y. Shaw, Carrollton, Tex.; Douglas A. Seeley, High Bridge, N.J.

[73] Assignee: Hoechst Celanese Corporation, Somerville, N.J.

[21] Appl. No.: 630,091

[22] Filed: Dec. 19, 1990

[51] Int. Cl.$^5$ .................... G03B 33/04; G03F 3/06
[52] U.S. Cl. .................... 430/200; 430/293; 430/358
[58] Field of Search .................... 430/200, 293, 5, 358, 430/363

[56] References Cited

U.S. PATENT DOCUMENTS

| | | | |
|---|---|---|---|
| 4,621,271 | 11/1986 | Brownstein | 346/76 PH |
| 5,049,476 | 9/1991 | Platzer | 430/253 |

FOREIGN PATENT DOCUMENTS

| | | | |
|---|---|---|---|
| 76033450 | 3/1975 | Japan . | |
| 2083726 | 3/1982 | United Kingdom . | |
| 2179472A | 3/1987 | United Kingdom | 430/5 |

Primary Examiner—Charles L. Bowers, Jr.
Assistant Examiner—Mark F. Huff
Attorney, Agent, or Firm—Andrew F. Sayko, Jr.

[57] ABSTRACT

A process for producing a color image on color proofing film which comprises:
(i) providing digital data representative of the shape and color of an original image;
(ii) inputting the digital data into a computer;
(iii) providing a color printer which is in communication with and controlled by the computer;
(iv) providing the printer with a precoated photosensitive color proofing film, a thermal wax and means for transferring the wax to the color proofing film;
(v) melting the thermal wax, in response to the digital data, in a manner which provides a pattern corresponding to the shape of the original image, the pattern providing a temporary wax optical mask;
(vi) exposing the photosensitive layer of the color proofing film, through the thermal wax optical mask, to actinic radiation, the wax on the color proofing film absorbing the actinic radiation, whereby a photoreaction occurs in the exposed areas of the photosensitive layer of the color proofing film; and
(vii) developing the color proofing film to provide a color image corresponding to the original image.

5 Claims, No Drawings

METHOD OF THERMAL WAX TRANSFER AS A MASK FOR DIGITAL COLOR PROOFING

BACKGROUND OF THE INVENTION

In recent years, thermal transfer systems have been developed to obtain prints from pictures which have been generated electronically, e.g. from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta, black and yellow signals. The process is then repeated for the other two colors. A color hard copy is thus obtained which corresponds to the original picture viewed on a screen. Further details of this process and an apparatus for carrying it out are contained in U.S. Pat. No. 4,621,271 by Brownstein entitled "Apparatus And Method For Controlling A Thermal Printer Apparatus," issued Nov. 4, 1986, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB No. 2,083,726A, the disclosure of which is hereby incorporated by reference.

Conventionally, there are known a thermosensitive image transfer sheet comprising a support material and a sublimable dye layer formed on the support material, and a thermosensitive image transfer sheet comprising a support material and a thermofusible ink layer comprising a thermofusible material and a pigment, capable of forming images on a receiving sheet by subjecting the thermosensitive image transfer medium to thermal printing.

The method which uses a sublimable dye is superior in image gradation reproduction, but is low in thermal sensitivity and has the drawback of inferior durability of the image. On the other hand, the method which uses a thermofusible material and a pigment is superior in thermosensitivity and the durability of the produced images, but has the drawback of providing poor image gradation.

At the present time, color proofing requires the use of silver halide color separation films which represent all four colors in an image. The intention of digital color proofing is to construct a color proof from digital data without making the silver halide separation films. One approach to creating a digital image is to use a laser scanner to scan a laser beam over a photosensitive material, modulating the laser beam with digital image data. Photosensitive color films which use diazo technology are not very sensitive to laser light.

Thermal wax transfer is a process whereby a wax image which absorbs actinic light is thermally transferred to a carrier sheet upon which is coated a colored photosensitive layer. The present invention combines the digital imaging speed of thermal wax transfer with the color/density control of pre-coated photosensitive color films.

SUMMARY OF THE INVENTION

The present invention eliminates the need for silver halide separation films by using a wax transfer image as a temporary mask. A wax image is produced from digital data on the carrier of a film sandwich with the following construction: carrier, photosensitive layer, adhesive, and support. The wax on the film absorbs actinic radiation. Blanket exposure with actinic light causes a photoreaction in the light-struck areas of the color proofing film, where there is no wax present. The wax image and the support are peeled off, and developing provides a colored image. Alternatively, the color proofing film is peel developed by peeling off a disposable development sheet.

Advantages involve the fact that density control of the wa image is not critical since it is used as a mask. The density of the proof is controlled by the pre-coated photosensitive color films. In addition, the thermal wax is a temporary mask which may also be used as a separation for future proofing.

The present invention relates to a method of preparing a color proof directly from digital data, by first forming a mask on a carrier on which is coated a photosensitive color proofing film. The mask is formed by a thermal wax transfer process. After formation of the mask, the color proofing film is exposed to actinic radiation through the wax image, the wax on the film absorbing the actinic radiation, which induces a photoreaction in the photosensitive layer in the light-struck areas. The mask may be removed by peeling away the carrier, and the color coat is processed to produce the color image. This invention directly uses digital data generated by a computer such as the MacintoshII CX computer and output may be directly on a printer, such as a Tektronix printer.

DETAILED DESCRIPTION OF THE PREFERRED EMBODIMENTS

Any suitable thermal wax may be utilized in the process of the present invention. These include paraffin wax, carnauba wax, urethane waxes and the like. When the images are produced on a computer printer, the thermal wax is preferably transferred onto the color proofing film from a thermal wax transfer ribbon, such as those available from the Aspen Company, the H.P. Smith division of J. R. Corporation, Tektronix Corporation and Precision Coating, Inc.

In the process of the present invention, a precoated photosensitive color proofing film is provided for a printer controlled by the digital data output of a computer, such as an Apple MacintoshII CX. Data, representing the desired image, is fed into the computer. This digital image data may be inputted either manually or via an automatic scanning device. A thermal wax is transferred onto the color proofing film, preferably by means of a thermal wax transfer ribbon. A wax image is produced on the color proofing film by either using a laser beam which is modulated with the digital image data or a thermal printing head with many heating elements which are heated up in response to the digital data signals. The thermal wax image functions as a temporary mask through which the color proofing film is exposed, the wax on the color proofing film absorbing actinic radiation, the non-wax areas being exposed to actinic radiation. A photoreaction occurs in the exposed areas of the photosensitive layer of the color proofing film. The exposed color proofing film is then developed to leave a first color image, e.g. cyan. The process is then repeated for the other colors (e.g., magenta, yellow and black) to provide a four color proof.

The present invention relates to a process for producing a color image on color proofing film which comprises:

(i) providing digital data representative of the shape and color of an original image;
(ii) inputing the digital data into a computer;
(iii) providing a color printer which is in communication with and controlled by the computer;
(iv) providing the printer with a precoated photosensitive color proofing film, a thermal wax and means for transferring the wax to the color proofing film;
(v) melting the thermal wax, in response to the digital data, in a manner which provides a pattern corresponding to the shape of the original image, the pattern providing a temporary thermal wax optical mask, wherein the wax absorbs actinic radiation;
(vi) exposing the photosensitive layer of the color proofing film, through the thermal wax optical mask, to actinic radiation, whereby a photoreaction occurs in the non-wax exposed areas of the photosensitive layer of the color proofing film; and
(vii) developing the color proofing film to provide a color image corresponding to the original image.

A number of suitable color proofing films may be utilized in the process of the present invention. For example, a four layer film comprising a base sheet, an adhesive layer, a color sheet and a cover sheet may be used and, after exposure to actinic. radiation, either peel developed or peeled and then wet developed, to provide a color image. Similarly, a four layer color proofing film comprising a temporary base sheet, an adhesive layer, a color layer and a cover sheet may also be utilized. The process would be conducted four times for each of cyan, magenta, yellow and black colors to provide a four color image corresponding to the color and shape of the original image.

The wax mask may be produced by heating the thermal wax with a scanning laser beam. The laser beam being modified by the digital data which is representative of the shape and color of the object. A thermal printing head comprising a plurality of heating elements which are heated up in response to the digital data which is representative of the shape and color of the original image may also be utilized.

Preferably, the photosensitive layer of the color proofing film is first exposed to actinic radiation which produces a first color the process is then repeated for the other colors, to thereby provide a four color proof.

EXAMPLE 1

An unexposed sheet of magenta peel developable color proofing film (color coat alone coated on Melinex 505) was prepared as described in U.S. Pat. No. 5,049,476 issued Sep. 17, 1991, the disclosure of which is herein incorporated by reference. From digital data in an Apple MacintoshII CX computer, a magenta separation image was printed by thermal wax transfer on the carrier side of the color proofing film color sheet via a Tektronix Phaser CPS Color printer using a Thermal Wax Transfer Ribbon. This was repeated for the remaining colors of the color proofing film: cyan, yellow, and black, but using the digital image corresponding to the separation of those colors. All four colors were exposed through the wax mask using a Siegfried Theimer GMBH Montakap Graphic Arts Exposure Unit using a 5 KW multispectrum lamp (Type THS5027) which caused a photoreaction in the non-wax, light struck areas. A sheet of temporary support was laminated to the receiver base 3020 and the carrier peeled off. The exposed cyan color proofing film color sheet was laminated to this adhesive layer and then peel-developed to leave a positive cyan image. A layer of temporary support was laminated on top of the cyan image and the carrier peeled off. Then, the exposed magenta proofing film color sheet color was laminated to this second adhesive layer and peel-developed to leave a positive magenta image. This process was repeated for the remaining colors yellow and black to give a four color proof showing a full range of half tone dots, good definition of lines in cyan, yellow, magenta and black, and resolution limited only by the Tektronix imaging capabilities.

EXAMPLE 2

A film sandwich of the peel developable color proofing film of Example 1, consisting, in order, of receiver base, adhesive layer, color coat, and a carrier sheet of Melinex 505 was prepared. A sheet of temporary support was laminated on the carrier and the carrier for the temporary support peeled off From digital data in the Apple MacintoshII CX computer, a separation image in black was printed by thermal wax transfer on a separate sheet of Melinex 505 via a Tektronix Color printer. The separation image on Melinex 505 was then laminated to the adhesive layer on the carrier of the color proofing film sandwich. The entire sandwich was exposed though the thermal wax mask to cause a photoreaction in the non-wax, light-struck areas. The image was peel-developed by peeling away the carrier sheet, adhesive layer and the Melinex 505 with the separation image, at the interface between the color coat and adhesive.

EXAMPLE 3

A sheet of temporary support was laminated to a color sheet of unexposed peel developable color proofing film of Example 1 and a film sandwich formed of a color coat on a Melinex 505 carrier sheet, as described in U.S. Pat. No. 5,049,476 issued Sep. 17, 1991. A sheet of temporary support was laminated on the carrier and the carrier for the temporary support was peeled off. From digital data in the Apple MacintoshII CX computer, a separation image was printed by thermal wax transfer on the carrier side of the color proofing film via a Tektronix Color printer. The film sandwich was exposed to light through the wax mask and laminated to the receiver base. The carrier for the color proofing film was peel-developed by peeling away the carrier sheet to leave a positive color image.

EXAMPLE 4

A solution for adhesion promotion was prepared containing the following formulation in grams:

| Carboset 525 | 5.00 |
|---|---|
| Conc Ammonium Hydroxide | 0.65 |
| Deionized Water | 84.35 |
| Isopropanol | 10.00 |

This solution was coated using a Meir rod #11 on the white support sheet of Tektronix OverHead Projection film and dried in an oven at 90° C. A color sheet of color proofing film (prepared as described in U.S. Pat. No. 4,650,738, the disclosure of which is herein incorporated by reference) was laminated to the dried coated side of the white Tektronix film. From digital data in the Apple MacintoshII CX computer, a separation image was printed by thermal wax transfer on the carrier side of the color proofing film via a Tektronix Color printer. After exposure to light through the wax image, the carrier was peeled-off and the color image was hand-developed using Colorlink aqueous developer (available from Hoechst Celanese Corporation) to leave a negative color image.

EXAMPLE 5

The Carboset formulation described in Example 4 was coated on the carrier of a color sheet of color proofing film (prepared as described in U.S. Pat. No. 4,650,738) and dried at 90° C. in an oven. From digital data in the Apple MacintoshII CX computer, a separation image was printed by thermal wax transfer on the coated carrier side of the color proofing film via a Tektronix Color printer. After exposure to light through the wax image, the color sheet was laminated to the receiver base and the carrier peeled-off. The color image was hand-developed using Colorlink aqueous developer to leave a negative color image.

EXAMPLE 6

The Carboset formulation described in Example 4 was coated with Meir rod 11 on the white support sheet of Tektronix OverHead Project film and dried in an oven at 90° C. A sheet of temporary support was laminated to the coated side of the Tektronix base and its carrier peeled off. A color sheet of color proofing film, prepared as described in U.S. Pat. No. 5,049,476 issued Sep. 17, 1991, was laminated to the adhesive layer on the Projection film support sheet. From digital data in the Apple MacintoshII CX computer, a separation image was printed by thermal wax transfer on the carrier side of the color proofing film via a Tektronix Color printer. After exposure to light through the wax image, the carrier of Transpeel was peeled off to leave a positive color image.

EXAMPLE 7

A color sheet of color proofing film (prepared as described in U.S. Pat. No. 4,659,642, the disclosure of which is herein incorporated by reference) was laminated to the white support sheet of Tektronix OverHead Projection film. From digital data in the Apple MacintoshII CX computer, a separation image was printed by thermal wax transfer on the carrier side of the color proofing film via a Tektronix Color printer. After exposure to light through the wax image, the carrier was peeled off and the color image was hand developed using Colorlink aqueous developer to leave a positive color image.

EXAMPLE 8

From digital data in the Apple MacintoshII CX computer, a separation image was printed by thermal wax transfer on the carrier side of a color sheet of color proofing film (prepared as described in U.S. Pat. No. 4,650,738) via a Tektronix Color printer. The color sheet was laminated to the receiver base 3020 and exposed to light through the wax mask. The carrier with the mask was peeled-off, and the color image was hand-developed using Colorlink aqueous developer to leave a negative color image.

We claim:

1. A process for producing a color image on color proofing film which comprises:
   (i) providing digital data representative of the shape and color of an original image;
   (ii) inputing said digital data into a computer;
   (iii) providing a color printer which is in communication with and controlled by said computer;
   (iv) providing said printer with a precoated photosensitive color proofing film, a thermal wax and means for transferring said wax to said color proofing film;
   (v) melting said thermal wax, in response to said digital data, in a manner which provides a pattern corresponding to the shape of said original image, said pattern providing a temporary thermal wax optical mask;
   (vi) exposing the photosensitive layer of said color proofing film, through said wax mask, to actinic radiation, whereby the wax on said color proofing film absorbs said actinic radiation and a photoreaction occurs in the non-wax, exposed areas of said photosensitive layer of said color proofing film; and
   (vii) developing said color proofing film to provide a color image corresponding to said original image.

2. The process of claim 1, wherein said means for transferring said thermal wax to said color proofing film comprises a thermal wax transfer ribbon.

3. The process of claim 1, wherein said wax mask is produced by heating said thermal wax with a scanning laser beam, said laser beam being modulated by said digital data which is representative of the shape and color of said original image.

4. The process of claim 1, wherein said wax mask is produced by a thermal printing head comprising a plurality of heating elements which are heated up in response to said digital data which is representative of the shape and color of said original image.

5. The process of claim 1, wherein said photosensitive layer of said color proofing film is exposed to actinic radiation which produces a first color and wherein the process is then repeated for the other colors to thereby provide a four color proof.

* * * * *